United States Patent
Ide et al.

(10) Patent No.: US 8,357,930 B2
(45) Date of Patent: Jan. 22, 2013

(54) ORGANIC ELECTROLUMINESCENCE DEVICE

(75) Inventors: Nobuhiro Ide, Katano (JP); Masahito Yamana, Takarazuka (JP); Hiroya Tsuji, Kyoto (JP); Norihiro Ito, Osaka (JP); Yoshio Mitsutake, Kashiba (JP); Masahiro Nakamura, Osaka (JP); Takeyuki Yamaki, Ikoma-gun (JP)

(73) Assignee: Panasonic Corporation, Osaka (JP)

( * ) Notice: Subject to any disclaimer, the term of this patent is extended or adjusted under 35 U.S.C. 154(b) by 513 days.

(21) Appl. No.: 12/675,101

(22) PCT Filed: Aug. 28, 2008

(86) PCT No.: PCT/JP2008/065431
§ 371 (c)(1),
(2), (4) Date: Feb. 24, 2010

(87) PCT Pub. No.: WO2009/028620
PCT Pub. Date: Mar. 5, 2009

(65) Prior Publication Data
US 2011/0121267 A1    May 26, 2011

(30) Foreign Application Priority Data
Aug. 28, 2007  (JP) ................. 2007-221845

(51) Int. Cl.
*H01L 35/24* (2006.01)
(52) U.S. Cl. ............. 257/40; 257/79; 257/E51.018; 313/504
(58) Field of Classification Search .......... 313/503–506, 313/113; 257/13, 40, 98, E51.018, E51.019, 257/72, 79; 438/99
See application file for complete search history.

(56) References Cited

U.S. PATENT DOCUMENTS

| 6,505,901 | B1 | 1/2003 | Fukuda |
| 7,956,529 | B2* | 6/2011 | Kuma et al. ............... 313/504 |
| 2003/0189401 | A1 | 10/2003 | Kido et al. |
| 2004/0195962 | A1 | 10/2004 | Nakamura et al. |
| 2005/0127822 | A1 | 6/2005 | Takeuchi et al. |
| 2005/0142379 | A1 | 6/2005 | Juni et al. |
| 2006/0192471 | A1 | 8/2006 | Inoue et al. |
| 2007/0029539 | A1 | 2/2007 | Yashima et al. |
| 2007/0069641 | A1 | 3/2007 | Hasegawa et al. |
| 2007/0182317 | A1 | 8/2007 | Kido et al. |
| 2009/0026921 | A1 | 1/2009 | Kuma et al. |
| 2009/0072733 | A1 | 3/2009 | Funayama et al. |

FOREIGN PATENT DOCUMENTS

| CN | 1447629 A | 10/2003 |
| JP | 2000-243573 A | 9/2000 |
| JP | 2003-272860 A | 9/2003 |
| JP | 2004-165154 A | 6/2004 |
| JP | 2004-296423 A | 10/2004 |
| JP | 2004-296429 A | 10/2004 |
| JP | 2005-174701 A | 6/2005 |
| JP | 2006-253015 A | 9/2006 |
| JP | 2006-288616 A | 10/2006 |
| JP | 2007-12370 A | 1/2007 |
| JP | 2007-43097 A | 2/2007 |
| JP | 2007-66883 A | 3/2007 |
| JP | 2007-123249 A | 5/2007 |
| WO | WO-2006/040704 A1 | 4/2006 |
| WO | WO-2006/095728 A1 | 9/2006 |
| WO | WO-2007/004476 A1 | 1/2007 |

OTHER PUBLICATIONS

The First Office Action for the Application No. 200880113738.1 from The State Intellectual Property Office of the People's Republic of China dated Mar. 30, 2011.
Supplementary European Search Report for the Application No. EP 08 82 8601 dated Mar. 9, 2011.
International Search Report for the Application No. PCT/JP2008/065431 mailed Dec. 16, 2008.

* cited by examiner

*Primary Examiner* — Jack Chen
(74) *Attorney, Agent, or Firm* — Cheng Law Group, PLLC

(57) ABSTRACT

An organic electroluminescence device comprises a light transmissive substrate, a light scattering region which is disposed on the light transmissive substrate, and a light emissive layer having a luminescent point. The luminescent point is spaced from the light reflective electrode by a distance of d which satisfies the following equation:

$$nd = a \times \frac{\lambda}{4}\left(2 + \frac{\phi}{\pi}\right)$$

wherein $$\phi = \tan^{-1}\left\{\frac{2(n_1 k_2 - n_2 k_1)}{n_1^2 - n_2^2 + k_1^2 - k_2^2}\right\}.$$

$\lambda$ is a wavelength of a specific light emitted from said light emissive layer.

n is a refractive index of a layer disposed between the luminescent point of the light emissive layer and the light reflective electrode, with respect to the wavelength of $\lambda$.

$n_1$ and $k_1$ are respectively a refractive index and an attenuation coefficient of the layer disposed between the luminescent point of the light emissive layer and the light reflective electrode, and is in contact with said light reflective electrode, with respect to the wavelength of $\lambda$.

$n_2$ and $k_2$ are respectively a refractive index and an attenuation coefficient of the light reflective electrode, with respect to the wavelength of $\lambda$.

a is a value that satisfies a relation of "$1.28 < a \leqq -5.56 \times n_{org}/n_{EML} + 7.74$"

$n_{org}$ is a refractive index of the layer disposed which is located between the luminescent point of the light emissive layer and the light reflective electrode and which is in contact with the light emissive layer, with respect to the wavelength of $\lambda$.

$n_{EML}$ is a refractive index of the light emissive layer with respect to the wavelength of $\lambda$.

6 Claims, 5 Drawing Sheets

ORGANIC ELECTROLUMINESCENCE DEVICE

TECHNICAL FIELD

This invention relates to organic electroluminescence devices which are used for illumination light sources, backlights of the liquid crystal display instrument, and flat panel displays. Particularly, this invention relates to an organic electroluminescence devices having good luminescence properties by employing a suitable optical design.

BACKGROUND ART

The organic electroluminescence device comprises a substrate, a light transmissive electrode which acts as an anode, a hole transport layer, a light emissive layer, an electron transport layer, and a light reflective electrode which acts as a cathod. The light transmissive electrode, the hole transport layer, the light emissive layer, the electron transport layer, and the light reflective electrode are formed on the substrate in order. When the voltage is applied between the light transmissive electrode and the light reflective electrode, electrons are injected into the light emissive layer through the electron transport layer. At the same time, the hole is injected into the light emissive layer through the hole transport layer. The hole in the light emissive layer is recombined to the electrons in the light emission layer, whereby the light is generated in the light emissive layer. The light generated in the light emissive layer is emitted through the light transmissive electrode and the light transmissive substrate.

The organic electroluminescence device is configured to emit the light spontaneously. In addition, the organic electroluminescence device is configured to emit the light having a high efficiency. The organic electroluminescence device is configured to emit the light having a variety color hue. Therefore, the organic electroluminescence device is of interest in employing lighting elements for the displays such as flat panel displays and also in employing light sources for the liquid crystal display instruments and the lighting fixtures. In addition, a part of the organic electroluminescence device is commercially used.

The organic electroluminescence device is realized by a thin film device having a thickness equal to optical wavelength order. The thickness of the device has closely correlative relationship with respect to the luminescence property. Therefore, the organic electroluminescence device should be designed to have an optically suitable thickness and also an electrically suitable thickness.

In the organic electroluminescence device, the light generated in the light emissive layer is totally reflected by boundaries of the electrodes and the layers. As a result, the light is confined within the light emissive layer, the electrodes, and the substrates. According to a simple estimation, when the light emissive layer generates the light, about 50% of the light is confined within the light emissive layer and the electrodes. About 30% of the light which is generated by the light emissive layer is confined within the substrates. Therefore, only about 20% of the light which is generated by the light emissive layer is emitted from the organic electroluminescence device to an outside. On the other hand, the organic electroluminescence device having a light scattering region is proposed in order to increase an amount of the light emitted from the organic electroluminescence devices. This configuration makes it possible to increase an amount of the light emitted from the organic electroluminescence devices to the about 40%.

In order to increase an amount of the light emitted to the outside, it is important to exactly determine distance between a luminescent point in the light emissive layer and the light reflective electrodes. The distance between the luminescent point in the light emissive layer and the light reflective electrodes is determined on the basis of a phase shift caused by the boundary between the light reflective electrode and an adjacent layer which is adjacent to the light reflective electrode. For example, Patent literature 1 shows a relationship of the luminescent point, the light transmissive electrode, and the light reflective electrode. Patent literature 1 discloses the luminescent point in the light emissive layer which is spaced from the light transmissive electrode by a first distance. The first distance is approximately equal to even integer multiple of a quarter of a luminescence wavelength. Patent literature 1 also discloses the luminescent point in the light emissive layer which is spaced from the light reflective electrode by a second distance. The second distance is approximately equal to odd integer multiple of the quarter of the luminescence wavelength. In contrast, Patent literatures 2 and 3 disclose that the phase shift is determined on the basis of an optical refraction index and an extinction coefficient of the layers between the light transmissive electrode and the light reflection electrode. The distance between the light transmissive electrode and the light reflection electrode is determined on the basis of thus determined phase shift. Patent literatures 4 and 5 also disclose that the distance between the electrodes is determined to a predetermined value.

That is, these organic electroluminescence devices have luminescent coefficient which depends on the thickness of the light transmissive layer. Especially, when the layers between the luminescent point and the light reflective electrode have limited optical thicknesses, the organic electroluminescence device has a good luminescent coefficient. The limited optical thickness is exemplified by an optical wavelength equal to (2 m+1)/4 times of the luminous wavelength. ("m" is an integer more than zero.)

However, the patent literature 1 discloses that when the light is reflected by the boundary of the light reflective electrode and the adjacent layer which is adjacent to the light reflective electrode, the phase of the light is shifted by $\pi$. Therefore, the phase shift is sufficiently unconsidered by the patent literature 1. In addition, the patent literature 2 discloses a case where a half value width of a spectrum is limited to equal to or less than 50 nm. In addition, although the patent literature 3 discloses the distance between the light transmissive electrode and the light reflective electrode, the distance between the luminescent point and the light reflective electrode is not defined. Furthermore, the patent literatures 1 to 3 does not discloses the light scattering region provided to the components such as substrates.

On the other hand, the patent literatures 4 and 5 disclose the organic electroluminescence devices which include the light scattering region. The light scattering region is configured to reflect the light and also is configured to vary refraction angles irregularly. Each one of the electroluminescence devices in the patent literatures 4 and 5 has the optical thickness which is more than (m+4)/4 times larger than the luminous wavelength. It is noted that thus formula is applied when "m" is the integer which is equal more than 0. Thus designation causes a thickness reduction between the light emissive layer and the light reflective electrode, whereby the designation causing an electrical short. In addition, if the organic electroluminescence device has two light emissive layers, a certain degree of a distance between the light emissive layer and the light reflective electrode is required. Therefore, the organic electroluminescence device having two light emissive layers is not capable of employing the thickness designed according to the patent literatures 4 and 5. This problem is also included by the organic electroluminescence devices in the patent literature 2.

Therefore, the light emissive layer needs to be spaced from the light reflective electrode by the distance of a certain degree. However, an organic electroluminescence device having the luminescent point which is spaced from the light reflective electrode by an arbitrary distance which is suitably determined on the basis of an arbitrary photoluminescence spectrum and which is larger than a certain degree is not reported. Especially, design principle of the organic electroluminescence device having the light scattering region is not indicated.

In addition, an organic electroluminescence devices having a light transmissive electrode, an organic semiconductor, an inorganic semiconductor, a charge supply layer composed of such as a charge generation layer made of an electron acceptability material and an electron donor material. In the organic electroluminescence devices, the light transmissive electrode, the organic semiconductor, the inorganic semiconductor, and the charge supply layer are interposed between the light emissive layers which are stacked along a thickness direction of the organic electroluminescence device. The organic electroluminescence device of this type is reported to achieve a high brightness and a long operation life. Therefore, these organic electroluminescence devices are of interest of a future commercial use. However, an optical design principle of the organic electroluminescence device with respect to the future commercial use is unapparent. In addition, literatures on these organic electroluminescence devices report no designing to employ the light scattering region. For example, when the optical distance between the luminescent point and the light reflective electrode is designed to have the thickness approximately equal to the odd integer multiple of one-quarter of the luminous wavelength, there is not necessarily that the organic electroluminescence device emits the light which increases to approximately equal to multiple of the number of the light emissive layers. In addition, when the light scattering region is disposed on the substrate in this design, this design causes decrease of an amount of the light emitted from the organic electroluminescence device.

Patent Literature 1: Japanese patent application publication No. 2000-243573A
Patent Literature 2: Japanese patent application publication No. 2004-165154A
Patent Literature 3: Japanese patent application publication No. 2006-253015A
Patent Literature 4: Japanese patent application publication No. 2004-296423A
Patent Literature 5: Japanese patent application publication No. 2004-296429A

DISCLOSURE OF THE INVENTION

This invention is achieved to solve the above problem. This invention has an object of providing an organic electroluminescence device which is suitably and optically designed in such manner that the organic electroluminescence device has a good luminescence property.

In order to solve the above problem, the organic electroluminescence device in this invention comprises a light transmissive electrode, a light reflective electrode, an organic luminescent layer, a light transmissive substrate, and a light scattering region. The organic luminescent layer is disposed between the light transmissive electrode and the light reflective electrode. The organic luminescent layer includes at least one light emissive layer. The light emissive layer contains a light emitting material. The light transmissive substrate is disposed on the light transmissive electrode away from the organic luminescent layer. The light scattering region is disposed on an outer surface of the light transmissive substrate. The light scattering region is configured to scatter the light confined within the light transmissive substrate of the organic electroluminescence device, and direct the light from the light transmissive substrate to the outside of the organic electroluminescence device. Therefore, this configuration makes it possible to increase an amount of the light emitted to the outside of the organic electroluminescence device. In addition, at least one the light emissive layer of the organic luminescent layer has a luminescent point. The luminescent point is spaced from the light reflective electrode by a distance of "d". The distance of "d" is defined by the following equation.

(Equation 1)

$$nd = a \times \frac{\lambda}{4}\left(2 + \frac{\phi}{\pi}\right) \quad (1)$$

$$\phi = \tan^{-1}\left\{\frac{2(n_1 k_2 - n_2 k_1)}{n_1^2 - n_2^2 + k_1^2 - k_2^2}\right\}$$

$\lambda$ is a wavelength of a specific light emitted from the light emissive layer.

n is a refractive index of a layer disposed between the luminescent point of the light emissive layer and the light reflective electrode, with respect to the wavelength of $\lambda$.

$n_1$ is a refractive index of the layer which is disposed between the luminescent point of the light emissive layer and the light reflective electrode, and which is in contact with the light reflective electrode, with respect to the wavelength of $\lambda$.

$k_1$ is an attenuation coefficient of the layer which is disposed between the luminescent point of the light emissive layer, and which is in contact with the light reflective electrode, with respect to the wavelength of $\lambda$.

$n_2$ is a refractive index of the light reflective electrode, with respect to the wavelength of $\lambda$.

$k_2$ is an attenuation coefficient of the light reflective electrode, with respect to the wavelength of $\lambda$.

a is a value that satisfies a relation that $1.28 < a \leq -5.56 \times n_{org}/n_{EML} + 7.74$.

$n_{org}$ is a refractive index of the layer which is disposed between the luminescent point of the light emissive layer and the light reflective electrode and which is in contact with the light emissive layer, with respect to the wavelength of $\lambda$.

$n_{EML}$ is a refractive index of the light emissive layer with respect to the wavelength of $\lambda$.

It is preferred that the wavelength of $\lambda$ is selected to be one that maximizes a product of a first term and a second term. The first term is defined as a spectral radiant flux of photoluminescence spectrum with regard to the light emitted from the light emissive layer. The second term is defined as the CIE's standard spectral luminous efficiency. The wavelength of $\lambda$ which satisfies the above relation is defined as $\lambda_1$. That is, the light emissive layer emits the light which includes a large number of light flux having the wavelength of $\lambda_1$. In order to enhance the light having a large number of the light flux each other, the luminescent point of the light emissive layer is spaced from the light reflective electrode by the distance of d which is determined by equation (1) and $\lambda_1$. Consequently, this configuration makes it possible to increase the light flux of the light which is enhanced each other between the luminescent point and the light reflective electrode. As a result, the light flux of the light is increased, whereby the light being emitted to an outside of the organic electroluminescence device through the light transmissive substrate. In contrast, it is also preferred that the wavelength of λ is selected to be one that maximizes a quotient of a spectral radiant flux of photoluminescence spectrum with regard to the light emitted from the light emissive layer divided by a photon energy at the wavelength of λ. The wavelength of λ which satisfies the above relation is defined as $\lambda_2$. The spectral radiant flux is proportional to photon number. Therefore, the wavelength when the photon number is increased is used. In order to enhance the light having a large number of the photon number, the luminescent point of the light emissive layer is spaced from the light reflective electrode by the distance of d which is determined in terms of the equation (1) and $\lambda_2$. As a result, the photon number of the light between the luminescent point and the light reflective electrode is increased. Therefore, the light emitted to the outside of the organic electroluminescence device is increased. It is possible to obtain the organic electroluminescence device having a high electrical current-to-photon conversion efficiency in such a manner that the thickness of the organic electroluminescence device is designed in order to increase the photon number.

It is preferred that two the organic luminescent layers are disposed between the light transmissive electrode and the light reflective electrode. The light transmissive substrate is disposed on the light transmissive electrode away from the organic luminescent layer. The light scattering region is disposed on an outer surface of the light transmissive substrate. In this case, the luminescent points of the light emissive layers of two the light emissive layer are respectively spaced from the light reflective electrode by the distance "d" which satisfies the equation (1).

The organic electroluminescence device with this configuration has the light reflective electrode which is spaced from both the luminescent points by the distances of "d". This distance of "d" is designed such that the light flux of the light is interfered with the other light flux of the light in order to enhance the light. Or, this distance of "d" is designed such that each one of the light is interfered with the other light in order to enhance the light. Therefore, the light flux or the photon number which enhances the light between the luminescent point and the light reflective electrode is increased. As a result, the light flux or the photon number of the light which is emitted to the outside of the organic electroluminescence device is increased. In addition, the organic electroluminescence device comprises the light scattering region which is configured to scatter the light which is confined within the light transmissive substrate, and also configured to direct the light which is confined within the light transmissive substrate. Therefore, it is possible to improve an extract efficiency of the light emitted to the outside of the organic electroluminescence device.

BEST MODE FOR CARRYING OUT THE INVENTION

Figure 1:
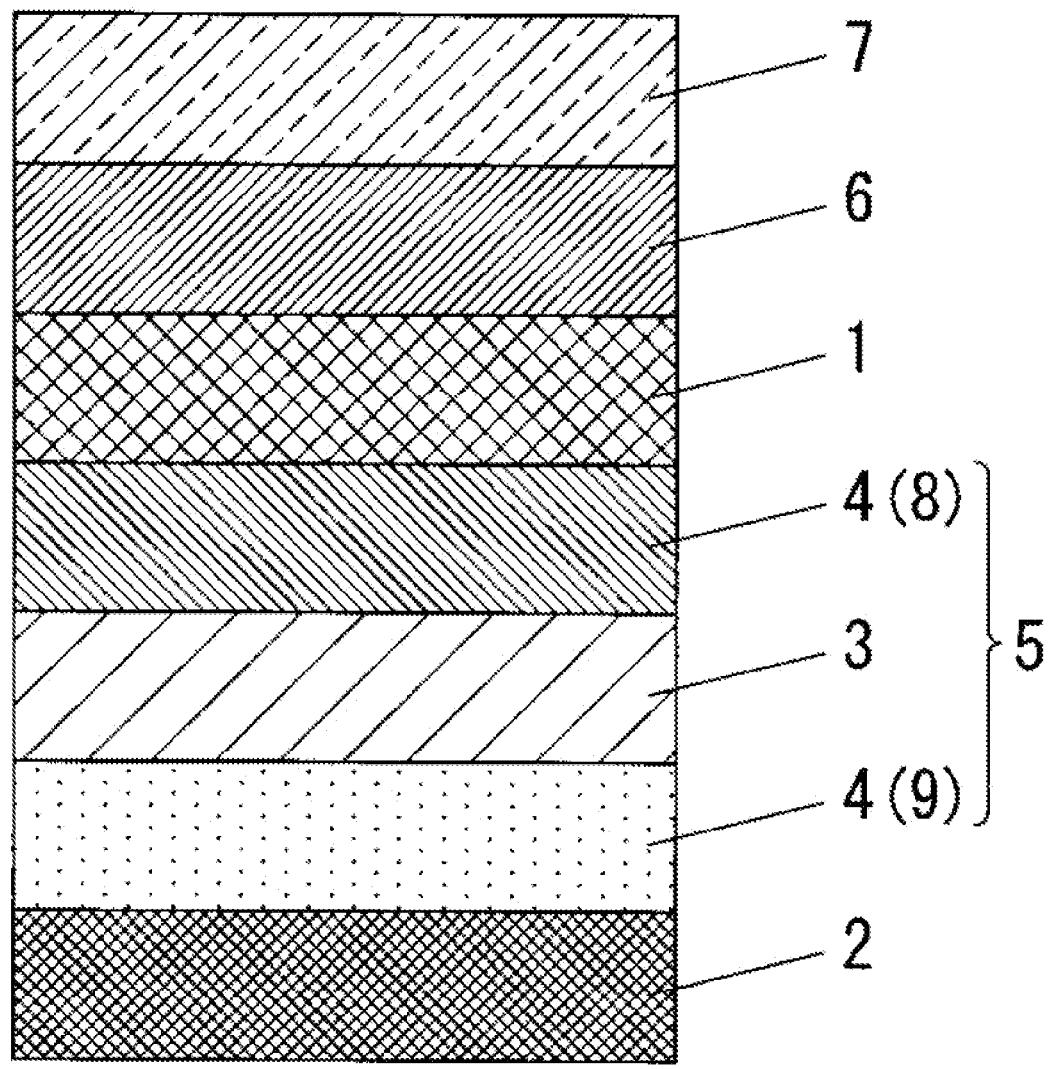
FIG. 1 shows a schematic side cross sectional view of an organic electroluminescence device.
Figure 2:
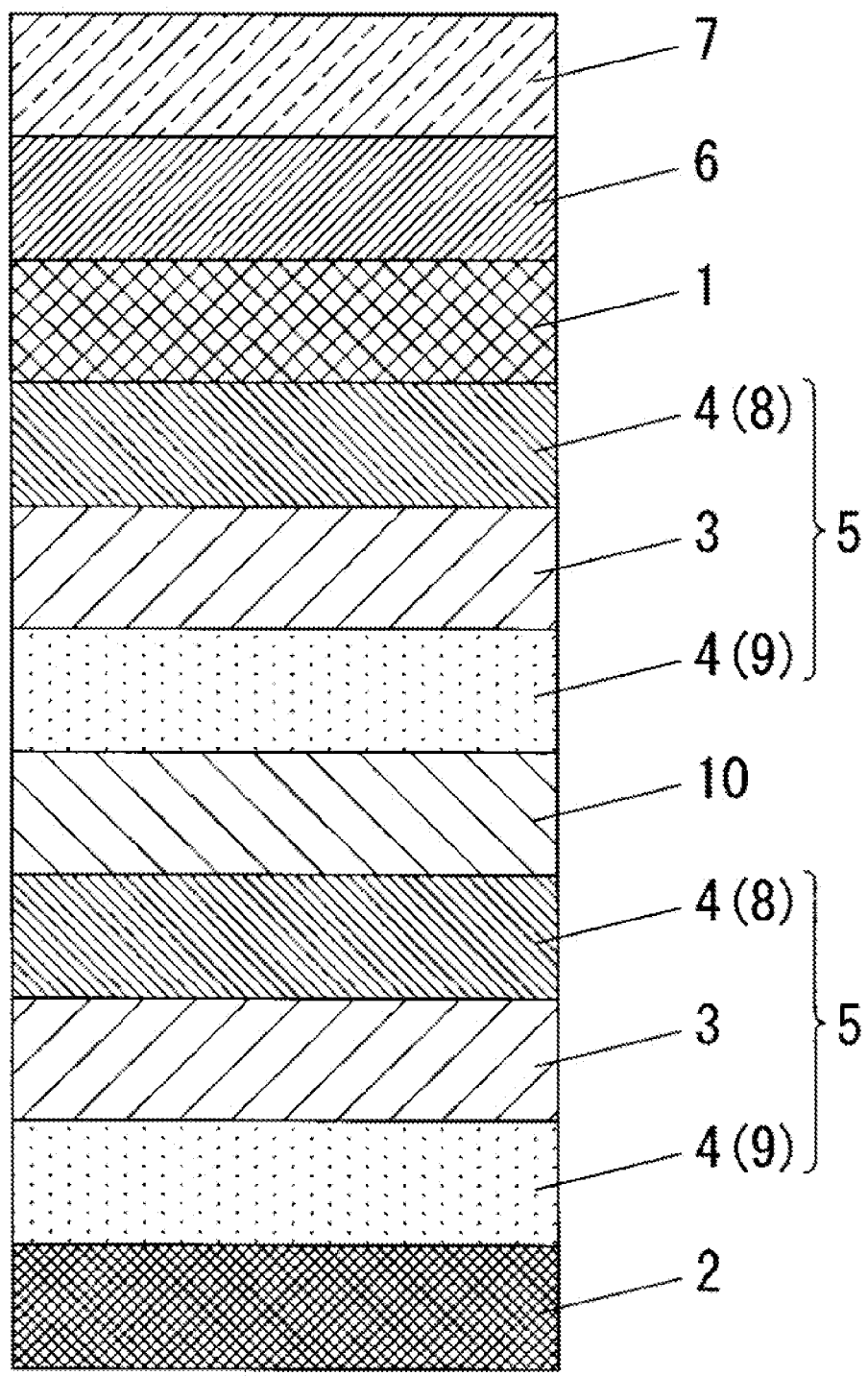
FIG. 2 shows a schematic side cross sectional view of an organic electroluminescence device.

Now, the best mode for carrying out the invention is explained. FIG. 1 shows one example of an organic electroluminescence device. This organic electroluminescence device comprises a light transmissive substrate 6 a light transmissive electrode 1, an organic luminescent layer 5, and a light reflective electrode 2. The light transmissive electrode 1 is disposed on the light transmissive substrate 6. The organic luminescent layer 5 is disposed on the light transmissive electrode 1. The light reflective electrode 2 is disposed on the organic luminescent layer 5. FIG. 2 also shows one example of an organic electroluminescence device having two the light emissive layers 3. This organic electroluminescence device comprises a light transmissive substrate 6, a first organic luminescent layer 5, a charge supply layer 10, a second organic luminescent layer 5, and a light reflective layer 2. The first organic luminescent layer 5 is disposed on the light transmissive substrate 6. The charge supply layer 10 is disposed on the first organic luminescent layer 5. The second organic luminescent layer 5 is disposed on the charge supply layer 10. The light reflective layer 2 is disposed on the second organic luminescent layer 5. Each the organic luminescent layer 5 is composed of a light emissive layer 3 and an organic layer 4. An organic layer 4 being composed of an electron injection layer, an electron transport layer 9, a hole blocking layer, a hole injection layer, a hole transport layer 8 if needed is arbitrary selected and is disposed on the light emissive layer 3. As shown in the illustration, the electron transport layer 9 is interposed between the light reflective electrode 2 and the light emissive layer 3. The hole transport layer 8 is interposed between the light transmissive electrode 1 and the light emissive layer 3. In addition, the light emissive layer 3 may have a plurality of the light emissive layers which are multilayered. In addition, the light transmissive substrate 6 is provided at its one outer surface with a light scattering region 7.

In addition, the organic electroluminescence device may have a plurality of the light emissive layer 3. In this case, a plurality of the charge supply layer 10 is interposed between the light transmissive electrode 1 and the light reflective electrode 2. The organic luminescent layer 5 is interposed between the light transmissive electrode and the charge supply layer 10. The organic luminescent layer 5 is interposed between the charge supply layers. The organic luminescent layer 5 is interposed between the charge supply layer 10 and the light reflective electrode 2. In such manner, the organic electroluminescence device is constructed. In addition, one organic luminescent layer 5 may includes a plurality of the light emissive layer 3. Even if one the organic luminescent layer 4 includes a plurality of the light emissive layer 3, the number of the light emissive layers 3 is not limited. However, when the number of the light emissive layers increases, difficulty of the optical and electrical design of the device is increased. Therefore, it is preferred that the number of the light emissive layers of the organic light emissive layer 3 is equal to or less than five. It is more preferred that the number of the light emissive layers of the organic light emissive layer 3 is equal to or less than three.

The light scattering region 7 is required to only have a property of varying directions of the light incident on the light scattering region 7. Therefore, the light scattering region 7 is not limited to a specified structure. For example, the light scattering region 7 may have its surface with an irregularity. The light scattering region 7 may also be provided with its boundary having a light reflectivity. The light scattering region 7 may also have a boundary which comes into contact with a media having a refraction index which is different from a refraction index of the light scattering region 7. In addition, it is possible to employ the light transmissive substrate 6 which is formed with particles and voids as the light scattering region. It is also possible to employ the light transmissive substrate 6 which is made of a plurality of materials mixed with each other as the light scattering region. Further, it is possible to employ the light transmissive substrate which formed at its surface with an irregularity as the light scattering region. That is, it is readily apparent to one skilled in the art that various substitutions and modifications may be made to the light scattering region disclosed herein without departing from the scope and spirit of the invention. For example, the light scattering region 7 may be realized by means of the light diffusion layer made of binder and light transmissive particles which is dispersed in the binder. The light transmissive particle is exemplified by silica and alumina each one of which has a light transmissive property. The light scattering region 7 having a light transmission rate of at least more than 50% is preferably used, and more than 80% is more preferably used. The light scattering region 7 is used to the organic electroluminescence device regardless of a property of variation of the light directionality. However, it is preferred for the organic electroluminescence device to employ the light scattering region 7 which is designed to pass the light through the light scattering region 7 without total reflection of the light.

In addition, the prior light transmissive substrate, the anode, the cathode, the light emissive layer 3, the electron transport layer 9, and the charge supply layer 10 is capable of employing to the organic electroluminescence device.

The light transmissive substrate 6 is exemplified by transparent glasses such as a soda lime glass and alkali-free glass, resins such as polyester, polyolefin, polyamide, and epoxy, and plastic film and plastic plate which are made of fluorine type resin.

The anode acts as an electrode for injecting the holes into the light emissive layer 3. The anode needs to have a high work function. Concerning the high work function, the anode is preferably made of materials such as metal, alloy, and chemical compound having an electrical conductivity. Especially, the electrode made of a material which has the work function of 4 eV is more preferably used as the anode. These materials of the anode are exemplified by the metal such as gold. In addition, CuI, ITO, $SnO_2$, ZnO, IZO are also used as the materials of the anode. Furthermore, electro conductive polymer such as DEPOT and polyaniline are used as the materials of the anode. Moreover, electro conductive polymers doped with the acceptor are used as the materials of the anode. In addition, a light transmissive materials having an electrical conductivity such as carbon nanotube are also used as the materials of the anode. The anode is formed on the light transmissive substrate 6 by vacuum deposition, sputtering, application, whereby the anode is formed into thin film.

Furthermore, when the light transmissive electrode 1 is employed as the anode, it is preferred to use the anode having the light transmission rate of equal to or more than 70%.

In addition, it is preferred to employ the anode having a sheet resistance of equal to or less than hundreds of ohms per square. Furthermore, it is more preferred to employ the anode having the sheet resistance of equal to or less than hundred of ohm per square. In the light of the above, it is preferred to design the anode having a thickness of equal to or less than 500 nm in order to adjust the sheet resistance of the anode as mentioned. In addition, it is more preferred to design the anode having the thickness which has a range of 10 nm to 200 nm.

The cathode is provided for injecting the electron into the light emissive layer 3. The cathode is required to have a low work function. In view of the low work function, the electrode is preferably made of materials such as metal, alloy, chemical compound having an electrical conductivity. It is more preferred to use the electrode having the work function of 5 eV or less as the cathode. The material of the cathode is exemplified by alkali metal, alkali metal halide, alkali metal oxide, alkali earth metal such as sodium, lithium, magnesium. In addition, the material of the cathode is exemplified by alkali metal alloy and alkali earth metal alloy such as sodium-potassium alloy, magnesium-silver alloy, magnesium-indium alloy, mixture of aluminum and lithium, mixture of magnesium and indium, aluminum-lithium alloy, and Al/LiF mixture. In addition, mixture of $Al/Al_2O_3$ is also used as the material of the cathode. Furthermore, it is also possible to use the electrode having a base layer of being made of alkali metal oxide, alkali metal halide, and metal oxide, and at least one a metal layer disposed on the base layer. The electrode having the base layer and the metal layer is exemplified by alkali metal/Al, alkali metal halide/alkali earth metal/Al, alkali metal oxide/Al. Moreover, it is possible to use the light reflective electrode 2 which is combination of the light transmissive electrode and the light reflective layer. When the light transmissive electrode 1 is used as the cathode, the cathode is formed by the light transmissive electrode which is represented by ITO and IZO. In this case, the cathode is formed on the substrate 6. In addition, the cathode may have the boundary made of an organic layer doped with the alkali metal or alkali earth metal such as lithium, sodium, cesium, calcium. The cathode is formed by the vacuum deposition and the sputtering of the above materials, whereby the cathode is formed to have a thin film. When the light reflective electrode 2 is used as the cathode, it is preferred to design the cathode having the light transmission rate of 10% or less. In addition, when the light transmissive electrode 1 is used as the cathode, it is preferred to design the cathode having the light transmission rate of 70% or more. In this case, the thickness of the cathode is arbitrary determined in terms of properties such as the light transmission rate of the cathode. However, the electrode having the thickness of 500 nm or less is preferably used for the cathode, and having the thickness of the range from 100 nm to 200 nm is more preferably used for the cathode.

The electron transport layer 9 is made of an appropriate compound having an electron transport property. The compound is exemplified by metallic complex such as Alq3 which acts as the electron transport material, phenanthroline derivative, pyridine derivative, tetrazine derivative, and hetero ring compound such as oxadiazole derivative. However, the compound of the electron transport layer 9 is not limited thereto. The electron transport layer 9 may be made of any well known electron transport material. Especially, the electron transport layer 9 made of the material having high electron transport property is preferably used.

In addition, the hole transport layer 8 is made of compound having a hole transport property. The compound having the hole transport property is exemplified by tryarylamine compounds, amine compounds which contains carbazole unit, and amine compounds which contains fluorine derivatives. The tryarylamine compounds is exemplified by "4,4'-bis[N-(naphthyl)-N-phenyl-amino]biphenyl (α-NPD)", "N,N'-diphenyl-N,N'-bis(3-methylphenyl)-(1,1'-biphenyl)-4,4'-diamine (TPD)", "2-TNATA", "4,4',4"-Tris(N-3-methylphenyl-N-phenylamino)triphenylamine (MTDATA)", "4,4'-N,N'-dicarbazole-biphenyl", "Spiro-NPD", "Spiro-TPD", "Spiro-TAD", "TNB". However, the electron transport layer 9 may be made of any well known hole transport material.

In addition, the light emissive layer 3 is made of a well known appropriate material for organic electroluminescence device. The material of the light emissive layer 3 is exemplified by anthracene, naphthalene, pyrene, tetracene, coronene, perylene, phtaloperylene, naphthaloperylene, diphenylbutadiene, tetraphenylbutadiene, coumarine, oxadiazole, bisbenzoxazoline, bistyryl, cyclopentadiene, quinoline metal complex, tris (8-hydroxyquinolinate) aluminum complex, tris (4-methyl-8-quinolinate) aluminum complex, tris (5-phenyl-8-quinolinate) aluminum complex, aminoquinoline metal complex, benzoquinoline metal complex, tri-(p-terphenyl-4-yl)amine, 1-aryl-2,5-di(2-thienyl)pyrrole derivatives, pyrane, quinacridone, rubrene, distyrylbenzene derivatives, distyrylarylenes derivatives, distyrylamine derivatives, fluorochromes, and these derivatives. However, the material of the light emissive layer 3 is not limited thereto. In addition, it is preferable to use the mixture of the above appropriate materials. Furthermore, the light emissive layer 3 may be made of materials which cause light emission from spin multiplicity in addition to the above mentioned materials which cause fluorescent emission. The material causing the light emission from the spin multiplicity is exemplified by compounds having phosphorescent properties, and compounds containing in one part of the compound having the phosphorescent property. In addition, the organic layer 4 is formed by a dry process of a deposition, a dry transfer printing, and wet process of spin coating, spray coating, die coating, and gravure printing.

The charge supply layer 10 is formed by a metal thin film, a light transmissive electrical conductive film, a laminated film, and a mixture. The metal thin film made of a material is exemplified by Ag, Au, and Al. The light transmissive electrical conductive film is exemplified by vanadium oxide, molybdenum oxide, rhenium oxide, tungsten oxide, ITO, IZO, AZO, GZO, ATO, and $SnO_2$. The laminated film is exemplified by films of n-type impurity semiconductor and a p-type impurity semiconductor. In addition, the laminated film is exemplified by films of at least one of an n-type impurity semiconductor and a p-type impurity semiconductor and at least one of a metal thin film and a light transmissive film. The mixture is exemplified by a mixture of n-type impurity semiconductor and the p-type impurity semiconductor, and a mixture of n-type impurity semiconductor and/or the p-type impurity semiconductor and the metal. Both the n-type impurity semiconductor and the p-type impurity semiconductor may be made of an organic material or an inorganic material. In addition, both the n-type impurity semiconductor and the p-type impurity semiconductor may be made of a mixture of the organic material and the metal, a mixture of the organic material and the metal oxide, a mixture of an organic material and an organic donor/acceptor material, and a mixture of the organic material and an inorganic donor/acceptor material. That is, the material of the charge supply layer 10 is not limited thereto, and is determined as necessary.

The organic electroluminescence device may have a luminescent point of at least one of the light emission layers 3 of the organic luminescent layer 5 which is spaced from the light reflective electrode 2 by a distance of "d". The distance of "d" satisfies the equation (2). Consequently, the light flux or the photon number is increased according to interference of the lights between the luminescent point and the light reflective electrode. Thus, this configuration makes it possible to increase the light flux or the photon number of the light which is emitted to the outside of the substrate 6. Furthermore, the organic electroluminescence device has the substrate 6 and the light scattering region 7 which is disposed on the outer surface of the substrate 6. Therefore, the light confined within the substrate 6 is scattered in order to send the light to the outside of the substrate 6. Therefore, this configuration makes it possible to improve an extract efficiency of the light to the outside of the organic electroluminescent device.

The luminescent point is determined as a point where the light emissive layer 3 emits the light which has a highest luminescent intensity in the light emissive layer 3 in a thickness direction of the light emissive layer 3. It is difficult to determine a position of the luminescent point according to an experiment directly. Therefore, the luminescent point is, for example, estimated by means of an optical calculation on the basis of a dependence property of the thickness of the photoluminescence spectrum. The luminescent point is also determined by means of an experimental rule on the basis of carrier mobility and an energy level of the organic layers of the light emissive layer 3, the hole transport layer 8, and the electron transport layer 9. In addition, luminescent point is ranged within a thickness direction of the light emissive layer 3. In this case, the point where the highest luminescent intensity of the light is determined as a representative point of the luminescent point.

(Equation 2)

$$nd = a \times \frac{\lambda}{4}\left(2 + \frac{\phi}{\pi}\right) \quad (2)$$

λ is a wavelength of a specific light emitted from the light emissive layer. In this invention, $\lambda_1$ is used as λ of equation (2). $\lambda_1$ is determined by following method. First, the photoluminescence spectrum of the light emitted from the light emissive layer is measured. Second, a spectral radiant flux of the photoluminescence spectrum in each wavelength is obtained on the basis of the photoluminescence spectral. Third, maximizes of products of "a spectral radiant flux of photoluminescence spectrum with regard to the light emitted from the light emissive layer" and "the CIE's standard spectral luminous efficiency" is calculated. Finally, one of the wavelengths that maximize the product is selected as $\lambda_1$. Or, in this invention, $\lambda_2$ is used as λ of equation (2). $\lambda_2$ is determined by following method. First, the photoluminescence spectrum of the light emitted from the light emissive layer is measured. Second, the photoluminescence spectrum is divided by a photon energy at each wavelength. In this manner, quotients of a spectral radiant fluxes divided by a photon energy at the wavelength of λ is obtained. Finally, one of the wavelengths that maximize the quotient is selected as $\lambda_2$. That is, the wavelength of $\lambda_1$ or $\lambda_2$ is used as λ of the equation (2). Consequently, a condition where the light flux or the photon number is increased is derived.

Furthermore, φ of the equation (2) represents a phase shift which is caused by the layer between the light reflective electrode 2 and a predetermined layer. A predetermined the layer is located between the light reflective electrode 2 and the light emissive layer 3 and is in contact with the light reflective electrode 2. φ is represented by an equation (3).

(Equation 3)

$$\phi = \tan^{-1}\left\{\frac{2(n_1 k_2 - n_2 k_1)}{n_1^2 - n_2^2 + k_1^2 - k_2^2}\right\} \quad (3)$$

In the equation 3, $n_1$ is a refractive index of the layer which is disposed between the light emissive layer and the light reflective electrode 2, and which is in contact with the light reflective electrode 2, with respect to the wavelength of λ. $k_1$ is an attenuation coefficient of the layer which is disposed between the light emissive layer and the light reflective electrode 2 and which is in contact with the light reflective electrode 2, with respect to the wavelength of λ. $n_2$ is a refractive index of the light reflective electrode 2, with respect to the wavelength of λ. $k_2$ is an attenuation coefficient of the light reflective electrode 2, with respect to the wavelength of λ.

Furthermore, in the equation 2, "n" is a refractive index of a layer disposed between the luminescent point of the light emissive layer and the light reflective electrode, with respect to the wavelength of λ. nd is an optical distance between the luminescent point and the light reflective electrode, with respect to the wavelength λ. If the organic electroluminescence device has a plurality of the layers between the luminescent point and the light reflective electrode 2, the optical distance nd is calculated by means of the following equation in terms of the thickness and the refractive index of each the layer.

$$nd = n_a \times d_a + n_b \times d_b + \ldots$$

"$n_a$" and "$n_b$" are the refractive indexes of the layers a and b respectively between the luminescent point and the light reflective electrode 2. "$d_a$" and "$d_b$" are the thicknesses of the layers a and b respectively between the luminescent point and the light reflective electrode 2. When a plurality of values of "$d_a$", "$d_b$" . . . is combined, "nd" is appropriately determined such that nd satisfies the equation (2).

In addition, "a" of the equation (2) satisfies the following equation. "$1.28 < a \leq -5.56 \times n_{org}/n_{EML} + 7.74$" In this equation, $n_{org}$ is a refractive index of the layer disposed between the luminescent point of the light emissive layer, and is in contact with the light emissive layer, with respect to the wavelength of λ. $n_{EML}$ is a refractive index of the light emissive layer 3, with respect to the wavelength of λ. The range of "a" is developed by an analysis on the basis of an actual measurement value of a maximum value or value adjacent to the maximum value of the light flux or the photon number. It is noted that it is required to satisfy the following relationship between $n_{org}$ and $n_{EML}$ such that "a" satisfies the above equation. "$1.162 \times n_{EML} > n_{org}$" In addition, it is preferred that norg and nEML satisfies the following relationship. "$n_{EML} \geq n_{org} - 0.05$" It is more preferred that norg and nEML satisfy the following relationship. "$n_{EML} \geq n_{org}$"

The method of obtaining the photoluminescence spectrum of the light emissive layer 3 is exemplified by a following method. First, the thin film made of host material which is mixed with dopant material at a ratio same as a mixture ratio of the light emissive layer 3 is formed on the substrate 6. Second, the thin film is peeled from the substrate 6, and is crushed into a fine powder. Third, the powder film is measured by the photoluminescence spectrum measurement apparatus.

In addition, the refractive index and the attenuation coefficient of the material of the organic electroluminescence device are measured by a refractive index measurement device of vertically incident type, and an ellipsometer. Consequently, a wavelength dependence of the refractive index and the attenuation coefficient is also measured.

To design the thickness of the organic electroluminescence device having the value satisfying the equation (2), the thickness and the refractive index of the layer between the light emissive layer 3 and the light reflective electrode 2 is adjusted. The layer between the light emissive layer 3 and the light reflective electrode 2 is such as the light emissive layer 3, the hole blocking layer, the electron transport layer 9, and the electron injection layer. In addition, when a plurality of the light emissive layer 3 is disposed within the organic electroluminescence device through the charge supply layer 10, it is possible to adjust the thicknesses and the refractive indexes of the hole transport layer 8, the hole injection layer, and the charge supply layer 10, except for the light emissive layer 3 in nearest position with respect to the light reflective electrode 2. These hole transport layer 8, hole injection layer, and the charge supply layer 10 are located adjacent to the light emissive layer 3. When the layers are adjusted to have a predetermined thickness on the basis of the above adjustment, there is a possibility of causing an electrical imbalance within the organic electroluminescence device. However, the thickness and the refractive index are adjusted by variations of a thickness ratio of the hole injection layer to the hole transport layer 8, a thickness ratio of the electron transport layer 9 to the electron injection layer. The thickness and the refractive index is also adjusted by variations of the material of each the layer. The thickness and the refractive index are also adjusted by adding material which varies the electron transport property. That is, the thickness and the refractive index are adjusted by an arbitrary method.

When, the organic electroluminescence device comprises a light reflective electrode 2 which acts as the anode, and a light transmissive electrode 1 which acts as the cathode and which is disposed on the substrate 6, the organic electroluminescence device has an inverted structure with respect to the above mentioned organic electroluminescence device. In this case, the thickness of the hole transport layer 8 which is located between the light emissive layer 3 and the light reflective electrode 2 is mainly adjusted. However, the method of adjusting the thickness of the layers is not limited thereto. Therefore, it is possible to adjust the thickness of the arbitrary layer.

In addition, if the organic electroluminescence device comprises an organic luminescent layer 5 which includes a plurality of the light emissive layer 3, it is required for at least one of the light emissive layers 3 to satisfy the equation (2) by using at least one of the wavelengths of $\lambda_1$ and $\lambda_2$. Consequently, it is possible to increase an amount of the light emitted from the organic electroluminescence device.

In addition, if the organic electroluminescence device comprises two the light emissive layers 3, it is possible to increase the light flux or the photon number which is emitted from the organic electroluminescence device having two the light emissive layers 3 each of which satisfies the above equation (2) by using at least one of the wavelengths of $\lambda_1$ and $\lambda_2$. In this case, the organic electroluminescence device has a first light emissive layer 3 and a second light emissive layer 3. The first light emissive layer is configured to emit the light having the wavelength which is selected to be one that maximizes a product of a spectral radiant flux of photoluminescence spectrum with regard to the light emitted from the light emissive layer and the CIE's standard spectral luminous efficiency. The second light emissive layer is configured to emit the light having the wavelength which is selected to be one that maximizes a product of a spectral radiant flux of photoluminescence spectrum with regard to the light emitted from the light emissive layer and the CIE's standard spectral luminous efficiency. The wavelength of the light emitted from the first light emissive layer is shorter than the wavelength of the light emitted from the second light emissive layer. It is preferred to dispose the second light emissive layer 3 which is located away from the light reflective electrode 2 than the first light emissive layer 3. Similarly, the first light emissive layer is configured to emit the light having the wavelength which is selected to be one that maximizes a quotient of a spectral radiant flux of photoluminescence spectrum with regard to the light emitted from the light emissive layer divided by the photon energy at the wavelength of λ. The second light emissive layer is configured to emit the light having the wavelength which is selected to be one that maximizes a quotient of a spectral radiant flux of photoluminescence spectrum with regard to the light emitted from the light emissive layer divided by the photon energy at the wavelength of λ. The first light emissive layer 3 is configured to emit the light which has the wavelength which is shorter than the wavelength from the second light emissive layer 3. It is preferred to dispose the second light emissive layer 3 which is located away from the light reflective electrode 2 than the first light emissive layer 3. With these configurations, it is easy to design both the first and the second light emissive layers 3 which satisfy the above equation (2).

The structure of increasing the emitted light flux or the photon number makes it possible for the organic electroluminescence device to not enhance the luminance of the light emitted from the organic electroluminescence device but to increase an amount of the light. Therefore, the organic electroluminescence device with the above mentioned structure is preferably used to the light source, the back light, and the lighting device which requires an amount of the light.

In addition, an amount of the light introduced into the substrate 6 from the light emissive layer 3 is increased by this configuration. (An amount of the light includes an amount of light confined within the substrate 6 and an amount of light emitted from the substrate 6.) Therefore, an arrangement of the light scattering region 7 on the substrate 6 increases the extract efficiency of the light emitted to the outside of the organic electroluminescence device.

In addition, in the organic electroluminescence device with this configuration, an amount of the light is increased without diminishing the distance between the light emissive layer 3 and the light reflective electrode 2. Therefore, this configuration is preferably employed to the organic electroluminescence device which needs to improve the electrical short between the light reflective electrode 2 and the light emissive layer 3. In addition, the organic electroluminescence device with this configuration may employ a thick hole transport layer. Furthermore, it is possible to form the hole transport layer by application in order to prevent contamination. With this configuration, reliability of the organic electroluminescence device is improved.

As mentioned above, the organic electroluminescence device with this configuration may achieve a high light extraction efficiency. Therefore, it is possible to obtain the organic electroluminescence device having a high efficiency.

Example 1

Figure 3:
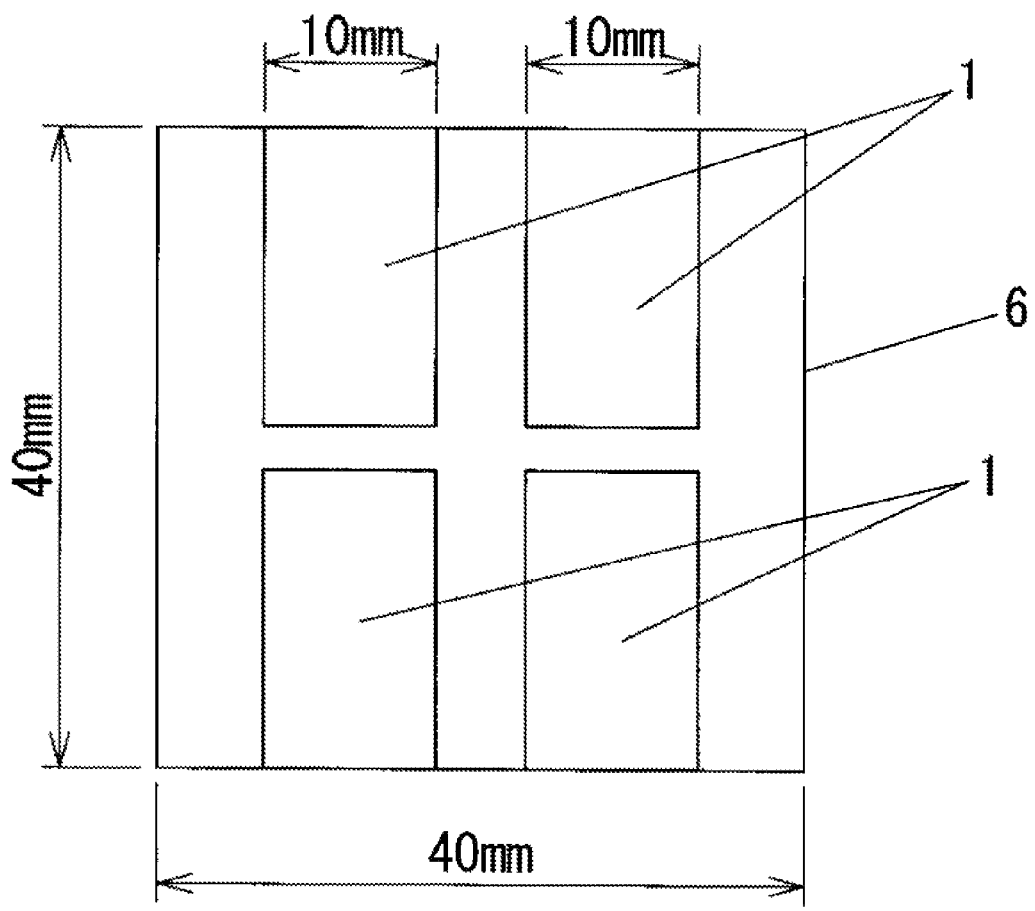
FIG. 3 shows a top view of a glass substrate with ITO after etching in the example.

In the organic electroluminescence device, the glass substrate 6 having a thickness of 0.7 mm was prepared. The glass substrate 6 was provided with ITO film. The ITO film had a thickness of 150 nm and had a sheet resistance of 10 ohm per square. The ITO film had a thickness of 150 nm, and had a sheet resistance of 10 ohm per square. The substrate 6 was etched and cut in order to form the glass substrate 6 with the ITO film having a size shown in FIG. 3. Consequently, the ITO film was formed as the anode which acts as the light transmissive electrode 1. The glass substrate 6 with the ITO was cleaned by ultrasonic cleaning with pure water, acetone, and isopropyl alcohol. Subsequently, the glass substrate 6 with the ITO was cleaned by vapor cleaning with vapor of the isopropyl alcohol. Subsequently, the glass substrate 6 with the ITO was cleaned by UV ozone cleaning for 10 minutes.

Figure 4:
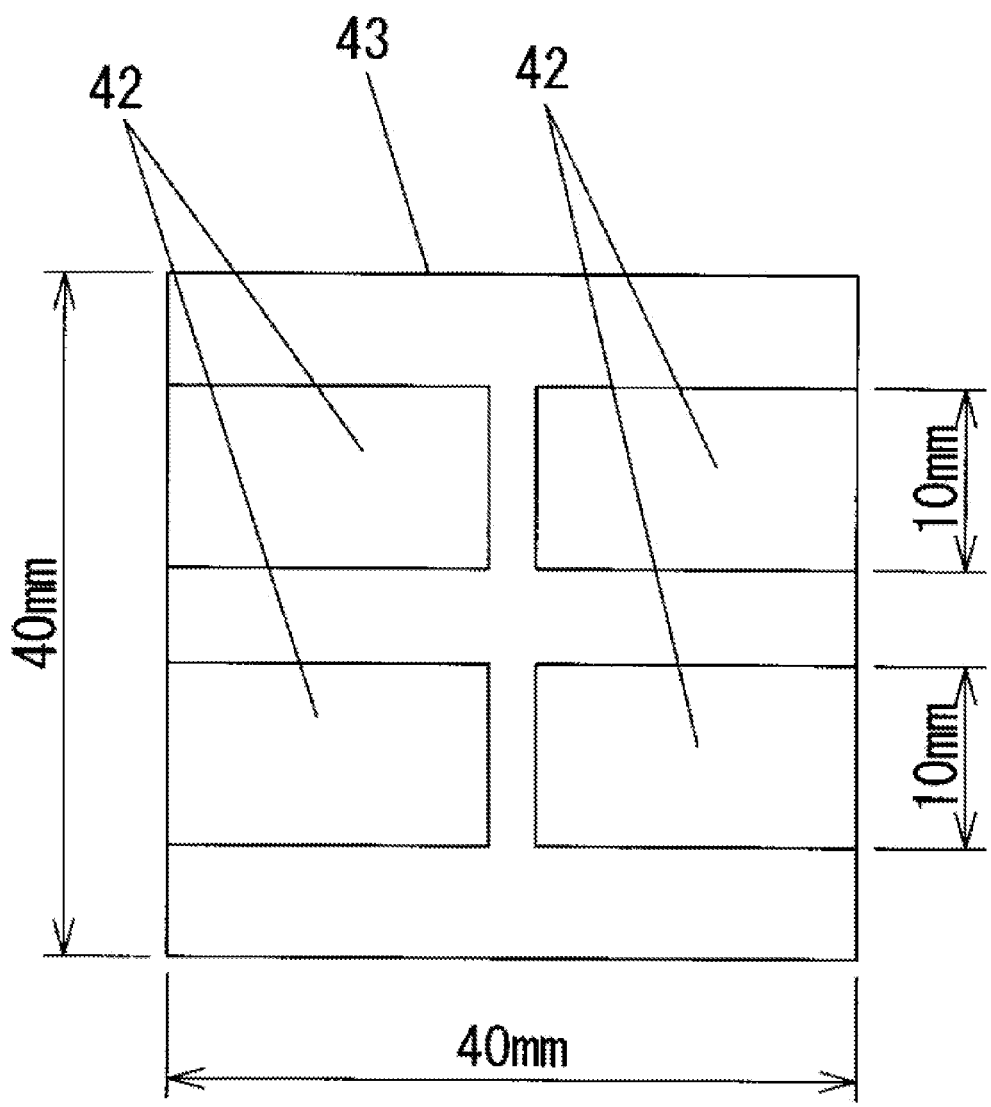
FIG. 4 shows a top view of a photomask for forming a hole transport layer, a light emissive layer, and an electron transport layer in the example.
Figure 5:
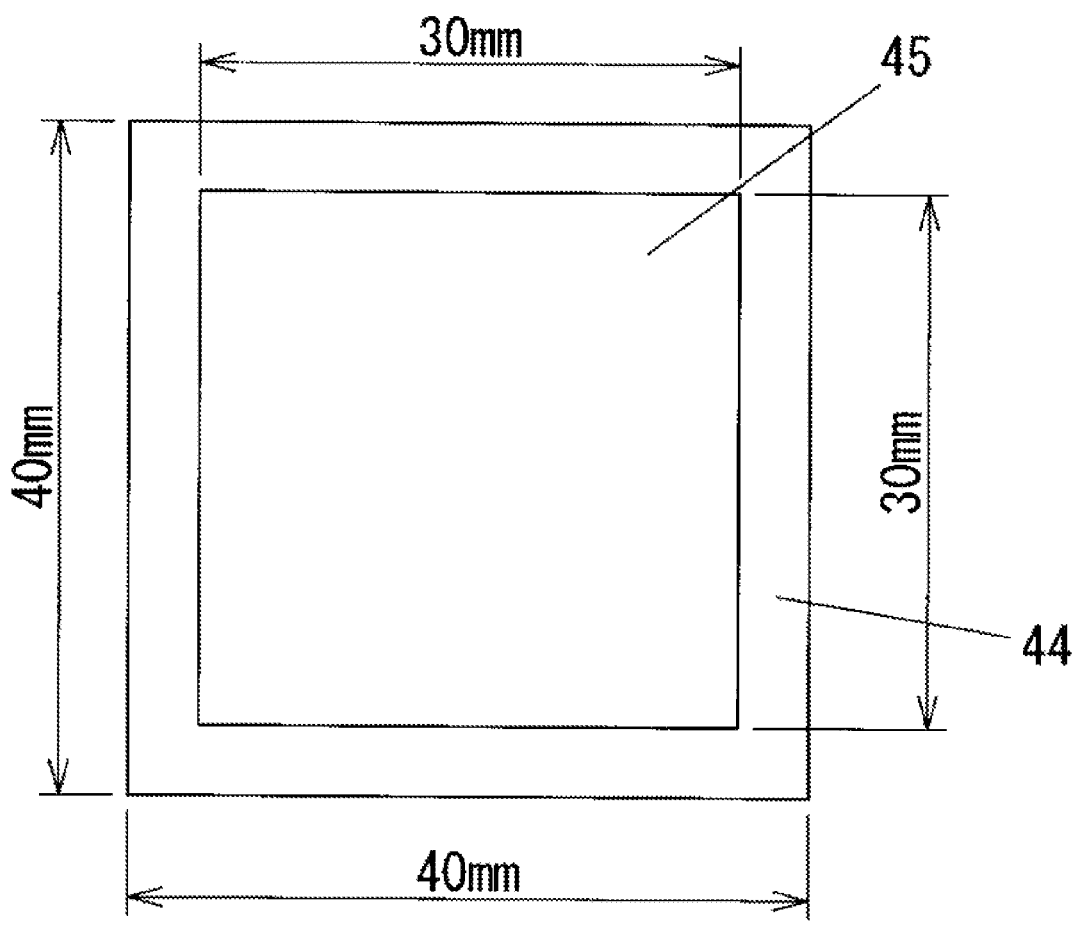
FIG. 5 shows a top view of a photomask for forming an electron injection layer and a light reflective electrode in the example.

Subsequently, the glass substrate 6 with the ITO was placed within a vacuum deposition equipment. The 4,4'-bis[N-(naphthyl)-N-phenyl-amino]biphenyl (α-NPD) was deposited on the opening 42 shown in FIG. 4 by using photomask 43 such that the 4,4'-bis[N-(naphthyl)-N-phenyl-amino]biphenyl (α-NPD) had a thickness of 40 nm. The 4,4'-bis[N-(naphthyl)-N-phenyl-amino]biphenyl (α-NPD) was deposited under reduced pressure of $5\times10^{-5}$ Pa. In this manner, the hole transport layer 8 of the 4,4'-bis[N-(naphthyl)-N-phenyl-amino]biphenyl (α-NPD) which act as the anode was formed on the ITO film. Subsequently, the light emissive layer 3 was formed on the hole transport layer 8. The light emissive layer 3 was made of Alq3 which was doped with the 7% of rubrene, and had a thickness of 20 nm. Subsequently, TmPyPhB was formed on the light emissive layer 3. TmPyPhB has a thickness of 300 nm, and acts as the electron transport layer 9. Subsequently, LiF was formed on the TmPyPhB with using the photomask having the opening shown in FIG. 5. LiF had a thickness of 1 nm, and act as the electron injection layer. Finally, Al is formed on the electron injection layer to have a thickness of 80 nm.

Example 2

The organic electroluminescence device was obtained in the same manner as in example 1 except that the electron transport layer 9 had a thickness of 350 nm.

Example 3

The organic electroluminescence device was obtained in the same manner as in example 1 except that the electron transport layer 9 had a thickness of 400 nm.

Comparative Example 1

The organic electroluminescence device was obtained in the same manner as in example 1 except that the electron transport layer 9 had a thickness of 200 nm.

Comparative Example 2

The organic electroluminescence device was obtained in the same manner as in example 1 except that the electron transport layer 9 had a thickness of 150 nm.

Example 4

The organic electroluminescence device was obtained in the same manner as in example 1 except for the electron transport layer 9. The electron transport layer 9 in the example 4 had a thickness of 270 nm, and was made of TpPyPhB.

Comparative Example 3

The organic electroluminescence device was obtained in the same manner as in example 4 except that the electron transport layer 9 has a thickness of 350 nm.

Example 5

The organic electroluminescence device being configured to emit blue light was obtained in the same manner as in example 1 except that the light emissive layer 3 and the electron transport layer 9. The light emissive layer 3 in the example 5 was made of TBADN which was doped with the 4% of TBP, and which had a thickness of 20 nm. The electron transport layer 9 in the example 5 was made of TpPyPhB and which had a thickness of 205 nm.

Comparative Example 4

The organic electroluminescence device being configured to emit the blue light was obtained in the same manner as in example 5 except that the electron transport layer 9 was made of TpPyPhB and had a thickness of 205 nm.

Example 6

The organic electroluminescence device being configured to emit the blue light was obtained in the same manner as in example 5 except that the electron transport layer 9 was made of TpPyPhB and had a thickness of 230 nm.

Comparative Example 5

The organic electroluminescence device being configured to emit the blue light was obtained in the same manner as in example 6 except that the electron transport layer 9 was made of TmPyPhB and had a thickness of 230 nm.

Example 7

The glass substrate 6 with ITO, the hole transport layer 8, and the light emissive layer 3 were obtained in the same manner as in example 1. Subsequently, TmPyPhB which act as the electron transport layer 9 was formed on the light emissive layer 3. Subsequently, TmPyPhB which was doped with Li was formed on the electron transport layer 9. The molar ratio of TmPyPhB to Li was 1:0.3. Subsequently, molybdenum oxide having a thickness of 10 nm was formed on the TmPyPhB. TmPyPhB act as the charge supply layer. Subsequently, the molybdenum oxide having a thickness of 10 nm was formed on the TmPyPhB. Furthermore, the NPD whch act as the hole transport layer 8 and which had a thickness of 50 nm was formed on the molybdenum oxide. Subsequently, TBADN which was doped with TBP was formed on the hole transport layer 8. TBADN act as the light emissive layer 3 and had a thickness of 20 nm. Subsequently, TpPyPhB which act as the electron transport layer 9 and which had a thickness of 220 nm was formed on the light emissive layer 3. Subsequently, LiF which act as the electron injection layer and which had a thickness of 1 nm was formed on the electron transport layer 9. Finally, Al which act as the cathode and which had a thickness of 80 was formed on the electron injection layer. In this manner, the organic electroluminescence device was obtained.

Comparative Example 6

The organic electroluminescence device was obtained in the same manner as in example 7 except for the electron transport layer 9. The electron transport layer 9 in this comparative example 6 was made of TpPyPhB and had a thickness of 350 nm.

(Photoluminescence Spectrum of the Light Emitting Material of the Light Emissive Layer 3)

(1) Rubrene

Co-deposited film was formed on the glass substrate 6. The co-deposited film was composed of Alq3 (which was used as a host) doped with 10% of rubrene (which was used as a luminescent dopant). Subsequently, the co-deposited film was detached from the glass substrate 6 by the spatula. Subsequently, the co-deposited film was disposed on the glass substrate 6. Subsequently, the photoluminescence spectrum of the co-deposited film was measured by a photoluminescence spectrum measurement device. As a result, the wavelength of maximum value of the photoluminescence spectrum of the co-deposited film was 559 nm.

In addition, a value of the product of the spectral radiant flux and the CIE's standard spectral luminous efficiency was maximized when the wavelength of $\lambda_1$ is equal to 559 nm. A value of the quotient of the spectral radiant flux divided by the photon energy in each wavelength was maximized when the wavelength of $\lambda_2$ is equal to 561 nm.

(2) TBP

Co-deposited film was formed on the glass substrate 6. The co-deposited film was composed of TBADN (which was used as the host shown in formula 1) doped with 4% of TBP (which was used as a luminescent dopant shown in the formula 2). The photoluminescence spectrum of the co-deposited film was measured in the same manner as in rubrene. A value of the product of the spectral radiant flux and the CIE's standard spectral luminous efficiency was maximized when the wavelength of $\lambda_1$ was 462 nm. A value of the quotient of the spectral radiant flux divided by the photon energy in each the wavelength was maximized when the wavelength of $\lambda_2$ is equal to 464 nm.

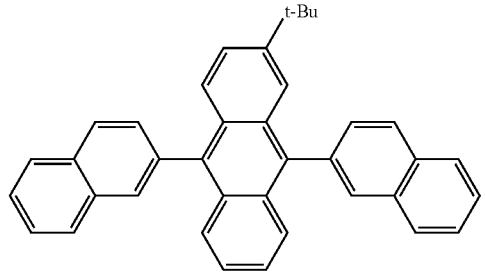

(Formula 1)

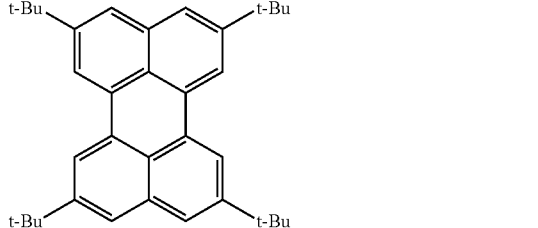

(Formula 2)

(Refractive Index, Attenuation Coefficient, and Phase Shift of the Material)

Table shows the refractive index, attenuation coefficient, and so on in the wavelengths of $\lambda_1$ and $\lambda_2$ of the rubrene and TBP in the organic electroluminescence device of the examples and comparative examples. The wavelengths of $\lambda_1$ and $\lambda_2$ in the rubrene are shown in Table 1. The wavelengths of $\lambda_1$ and $\lambda_2$ in the TBP are shown in Table 2.

The table shows the refractive indexes "n" and the attenuation coefficients "k" of TmPyPhB (formula 3) and TpPyPhB (formula 4). In addition, the table shows the refractive indexes "n" of other materials (NPD, Alq, TBADN, and $MoO_3$). Although Alq3 was doped with 7% of rubrene, an optical property of Alq3 singularly is used. Similarly, although TBADN was doped with 4% of TBP, an optical property of TBADN singularly is used. This is because an amount of the dopant with respect to the TBADN was few. In addition, refractive index of single TmPyPhB is used as a substitute for the refractive index of the TmPyPhB doped with Li (Formula 3)

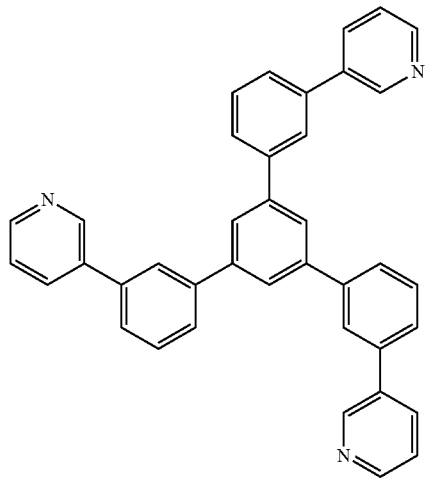

(Formula 4)

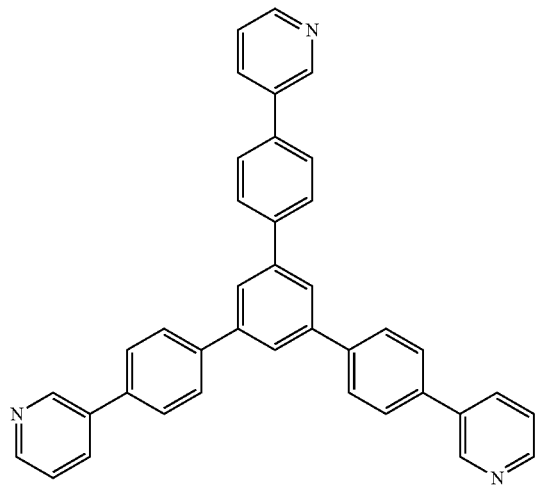

TABLE 1

|  | $\lambda_1$ (559 nm) | | | $\lambda_2$ (561 nm) | | |
| --- | --- | --- | --- | --- | --- | --- |
|  | refractive index | attenuation coefficient | phase shift | refractive index | attenuation coefficient | phase shift |
| NPD | 1.81 | | | 1.81 | | |
| Alq3 | 1.73 | | | 1.73 | | |
| TBADN | 1.78 | | | 1.78 | | |
| $MoO_3$ | 2.13 | | | 2.13 | | |

TABLE 1-continued

|  | $\lambda_1$ (559 nm) | | | $\lambda_2$ (561 nm) | | |
| --- | --- | --- | --- | --- | --- | --- |
|  | refractive index | attenuation coefficient | phase shift | refractive index | attenuation coefficient | phase shift |
| TmPyPhB | 1.74 | 0 | 2.61 | 1.74 | 0 | 2.61 |
| TpPyPhB | 1.94 | 0 | 2.56 | 1.94 | 0 | 2.56 |
| Al | 1.18 | 6.25 | | 1.18 | 6.25 | |

TABLE 2

|  | $\lambda_1$ (504 nm) | | | $\lambda_2$ (464 nm) | | |
| --- | --- | --- | --- | --- | --- | --- |
|  | refractive index | attenuation coefficient | phase shift | refractive index | attenuation coefficient | phase shift |
| NPD | 1.82 | | | 1.86 | | |
| Alq3 | 1.75 | | | 1.80 | | |
| TBADN | 1.81 | | | 1.85 | | |
| $MoO_3$ | 2.16 | | | 2.21 | | |
| TmPyPhB | 1.75 | 0 | 2.55 | 1.77 | 0 | 2.49 |
| TpPyPhB | 1.97 | 0 | 2.48 | 2.01 | 0 | 2.40 |
| Al | 0.91 | 5.62 | | 0.74 | 5.12 | |

(Evaluation)

The light scattering sheets were attached on the organic electroluminescence device obtained in each the examples and each the comparative examples through matching oil having a refractive index of 1.50, whereby the organic electroluminescence device were provided with the light scattering regions. The matching oil was a cargille standard refractive fluid series A of MORITEX Corporation. The light scattering sheet was light up 100 SXE of KIMOTO Corporation. Subsequently, the electrical current having a current density of 10 mA per square centimeter was supplied between the electrodes, whereby the emitted light was measured by the integrating sphere.

Table 3 shows results of the current efficiency of the light flux on the basis of the measurement result. In addition, Table 3 shows optical distances nd, wavelengths $\lambda_1$, phase shift $\phi$ with respect to the wavelength of $\lambda_1$, a value of "a" obtained by the equation (2) with using the optical distance nd and phase shift $\phi$, and ranges of "a" satisfying the equation (2) in a portion between the luminescent point and the light reflective electrode 2. Meanwhile, a portion where the light emissive layer 3 came into contact with the hole transport layer 8 might be identified as an optical distance nd. Therefore, the optical distance nd is represented as a sum of "a product of the refractive index of the light emissive layer 3 and its thickness" and "a product of the refractive index of the electron transport layer 9 and its thickness".

TABLE 3

| | | electron transport layer | | | | | range of "a" | |
| --- | --- | --- | --- | --- | --- | --- | --- | --- |
| | | material | thickness (nm) | nd (nm) | λ1 (nm) | φ | a | satisfying the equation (1) | current efficiency (lm/A) |
| Example 1 | | TmPyPhB | 300 | 556.6 | 559 | 2.61 | 1.4 | 1.28 < a ≦ 2.14 | 22.3 |
| Example 2 | | TmPyPhB | 350 | 643.6 | 559 | 2.61 | 1.62 | 1.28 < a ≦ 2.14 | 22 |
| Example 3 | | TmPyPhB | 400 | 730.6 | 559 | 2.61 | 1.84 | 1.28 < a ≦ 2.14 | 24.2 |
| Comparative example 1 | | TmPyPhB | 200 | 382.6 | 559 | 2.61 | 0.97 | 1.28 < a ≦ 2.14 | 10.8 |
| Comparative example 2 | | TmPyPhB | 150 | 295.6 | 559 | 2.61 | 0.75 | 1.28 < a ≦ 2.14 | 11 |
| Example 4 | | TpPyPhB | 270 | 558.4 | 559 | 2.56 | 1.42 | 1.28 < a ≦ 1.50 | 25.1 |
| Comparative example 3 | | TpPyPhB | 350 | 713.6 | 559 | 2.56 | 1.81 | 1.28 < a ≦ 1.50 | 20.4 |
| Example 6 | | TpPyPhB | 230 | 490.1 | 504 | 2.48 | 1.39 | 1.28 < a ≦ 1.82 | 20.1 |
| Comparative example 5 | | TmPyPhB | 230 | 439.5 | 504 | 2.55 | 1.24 | 1.28 < a ≦ 2.48 | 15.7 |
| Example 7 | 1st layer | TmPyPhB | | 722.8 | 560 | 2.56 | 1.82 | 1.28 < a ≦ 2.14 | 39.9 |
| | 2nd layer | TpPyPhB | 220 | 470.4 | 504 | 2.48 | 1.34 | 1.28 < a ≦ 1.82 | |
| Comparative example 6 | 1st layer | TmPyPhB | | 983.8 | 560 | 2.61 | 2.48 | 1.28 < a ≦ 2.14 | 27.6 |
| | 2nd layer | TpPyPhB | 350 | 736.4 | 504 | 2.48 | 2.10 | 1.28 < a ≦ 1.82 | |

In addition, Table 4 shows quantum efficiency of the emitted light which is proportional to the photon number. In addition, the table 4 also shows optical distances nd, wavelengths $\lambda_2$ phase shifts φ with respect to the wavelength $\lambda_2$, a value of "a" which is obtained by the equation (2) with using the optical distance nd and the phase shift φ and a range of "a" which satisfied the equation (2). In the examples and comparative examples, a portion where the light emissive layer 3 came into contact with the hole transport layer 8 is identified as the luminescent point. Therefore, the optical distance is represented as a sum of "a product of the refractive index of the light emissive layer 3 and its thickness" and "a product of the refractive index of the electron transport layer 9 and its thickness".

TABLE 4

| | electron transport layer | | | | | | range of "a" | quantum |
| --- | --- | --- | --- | --- | --- | --- | --- | --- |
| | material | thickness (nm) | nd (nm) | λ2 (nm) | φ | a | satisfying the equation (2) | efficiency (%) |
| Example 1 | TmPyPhB | 300 | 556.6 | 561 | 2.61 | 1.4 | 1.28 < a ≦ 2.14 | 3.5 |
| Example 2 | TmPyPhB | 350 | 643.6 | 561 | 2.61 | 1.62 | 1.28 < a ≦ 2.14 | 3.4 |
| Example 3 | TmPyPhB | 400 | 730.6 | 561 | 2.61 | 1.84 | 1.28 < a ≦ 2.14 | 3.8 |
| Comparative example 1 | TmPyPhB | 200 | 382.6 | 561 | 2.61 | 0.97 | 1.28 < a ≦ 2.14 | 1.7 |
| Comparative example 2 | TmPyPhB | 150 | 295.6 | 561 | 2.61 | 0.75 | 1.28 < a ≦ 2.14 | 1.7 |
| Example 4 | TpPyPhB | 270 | 558.4 | 561 | 2.56 | 1.42 | 1.28 < a ≦ 1.50 | 3.9 |
| Comparative example 3 | TpPyPhB | 350 | 713.6 | 561 | 2.56 | 1.81 | 1.28 < a ≦ 1.50 | 3.2 |
| Example 5 | TpPyPhB | 205 | 447 | 464 | 2.4 | 1.4 | 1.28 < a ≦ 1.69 | 5.1 |
| Comparative example 4 | TmPyPhB | 205 | 399.9 | 464 | 2.49 | 1.24 | 1.28 < a ≦ 2.40 | 3.8 |

The invention claimed is:

1. An organic electroluminescence device comprising:
   a light transmissive electrode,
   a light reflective electrode,
   an organic luminescent layer disposed between said light transmissive electrode and said light reflective electrode, said organic luminescent layer including at least one light emissive layer that contains a light emitting material,
   a light transmissive substrate disposed on said light transmissive electrode away from said organic luminescent layer; and
   a light scattering region disposed on an outer surface of said light transmissive substrate,
   wherein at least one said light emissive layer of said organic luminescent layer has a luminescent point which is spaced from said light reflective electrode by a distance (d) defined by the following equation:

$$nd = a \times \frac{\lambda}{4}\left(2 + \frac{\phi}{\pi}\right)$$

wherein $$\phi = \tan^{-1}\left\{\frac{2(n_1 k_2 - n_2 k_1)}{n_1^2 - n_2^2 + k_1^2 - k_2^2}\right\}$$

and wherein
$\lambda$ is a wavelength of a specific light emitted from said light emissive layer,
n is a refractive index of a layer disposed between the luminescent point of the light emissive layer and the light reflective electrode, with respect to the wavelength of $\lambda$,
$n_1$ and $k_1$ are respectively a refractive index and an attenuation coefficient of the layer disposed between the luminescent point of the light emissive layer and the light reflective electrode, and is in contact with said light reflective electrode, with respect to the wavelength of $\lambda$,
$n_2$ and $k_2$ are respectively a refractive index and an attenuation coefficient of the light reflective electrode, with respect to the wavelength of $\lambda$,
a is a value that satisfies a relation of "1.28<a≦−5.56×$n_{org}$/$n_{EML}$+7.74",
wherein
$n_{org}$ is a refractive index of the layer disposed which is located between the luminescent point of the light emissive layer and the light reflective electrode and which is in contact with the light emissive layer, with respect to the wavelength of $\lambda$, and
$n_{EML}$ is a refractive index of the light emissive layer with respect to the wavelength of $\lambda$.

2. An organic electroluminescence device as set forth in claim 1, wherein
   said wavelength of $\lambda$ is selected to be one that maximizes a product of a spectral radiant flux of photoluminescence spectrum with regard to the light emitted from the light emissive layer and the CIE's standard spectral luminous efficiency.

3. An organic electroluminescence device as set forth in claim 1, wherein
   said wavelength of $\lambda$ is selected to be one that maximizes a quotient of a spectral radiant flux of photoluminescence spectrum with regard to the light emitted from the light emissive layer divided by a photon energy at the wavelength of $\lambda$.

4. An organic electroluminescence device as set forth in claim 1, wherein
   two said organic luminescent layers are disposed between said light transmissive electrode and said light reflective electrode, said light transmissive substrate being disposed on said light transmissive electrode away from said organic luminescent layer; and said light scattering region being disposed on an outer surface of said light transmissive substrate.

5. An organic electroluminescence device as set forth in claim 2, wherein
   two said organic luminescent layers are disposed between said light transmissive electrode and said light reflective electrode, said light transmissive substrate being disposed on said light transmissive electrode away from said organic luminescent layer; and said light scattering region being disposed on an outer surface of said light transmissive substrate.

6. An organic electroluminescence device as set forth in claim 3, wherein
   two said organic luminescent layers are disposed between said light transmissive electrode and said light reflective electrode, said light transmissive substrate being disposed on said light transmissive electrode away from said organic luminescent layer; and said light scattering region being disposed on an outer surface of said light transmissive substrate.

* * * * *